(12) United States Patent
Chen et al.

(10) Patent No.: US 11,582,504 B2
(45) Date of Patent: Feb. 14, 2023

(54) IMAGE SIGNAL TRANSMISSION APPARATUS AND SIGNAL OUTPUT CIRCUIT APPLYING BANDWIDTH BROADENING MECHANISM THEREOF

(71) Applicant: REALTEK SEMICONDUCTOR CORPORATION, Hsinchu (TW)

(72) Inventors: Tsung-Ming Chen, Hsinchu (TW); Cheng-Yu Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/674,867

(22) Filed: Feb. 18, 2022

(65) Prior Publication Data
US 2022/0272401 A1   Aug. 25, 2022

(30) Foreign Application Priority Data

Feb. 25, 2021   (TW) ................................. 110106730

(51) Int. Cl.
*H04N 21/426*   (2011.01)
*H04N 21/4363*   (2011.01)

(52) U.S. Cl.
CPC . *H04N 21/42607* (2013.01); *H04N 21/43635* (2013.01)

(58) Field of Classification Search
CPC .................... H04N 21/42607; H04N 21/43635
See application file for complete search history.

(56) References Cited

U.S. PATENT DOCUMENTS 4,920,233 A * 4/1990 Kincaid ............... H01B 11/146
                                                          178/45
5,125,100 A * 6/1992 Katznelson ............ H04H 20/78
                                                          348/E7.024
(Continued)

FOREIGN PATENT DOCUMENTS

CN   109450471 A   3/2019

OTHER PUBLICATIONS

OA letter of the counterpart TW application (appl. No. 110106730) dated Oct. 29, 2021. Summary of the OA letter: 1. Claims 1~5 and 9~10 are rejected as being unpatentable over the disclosure of the cited reference 1 (CN 109450471 A, also published as U.S. Pat. No. 10,979,256B2). 2. Claims 6~8 are allowable. Correspondence bewteen claims of TW counterpart application and claims of US application: 1. Claims 1~10 in TW counterpart application correspond to claims 1~9 and 11 in US application, respectively.

*Primary Examiner* — Michael B. Pierorazio
(74) *Attorney, Agent, or Firm* — WPAT, PC

(57) ABSTRACT

The present invention discloses a signal output circuit applying bandwidth broadening mechanism for an image signal transmission apparatus that includes a first driving circuit and a second driving circuit. The first driving circuit includes a continuous time linear equalizer (CTLE) and is configured to receive a digital input signal to perform a high frequency enhancement thereon to increase a bandwidth of the digital input signal to generate a first output signal, in which a zero point and two poles of a frequency response of the first driving circuit are determined by circuit parameters thereof. The second driving circuit is configured to receive and amplify the first output signal to generate a second output signal for an image receiving apparatus.

18 Claims, 2 Drawing Sheets

(56) References Cited

U.S. PATENT DOCUMENTS

| | | | | | |
|---|---|---|---|---|---|
| 5,481,389 | A * | 1/1996 | Pidgeon | | H04B 10/2933 398/208 |
| 5,604,528 | A * | 2/1997 | Edwards | | H04N 7/167 380/240 |
| 5,834,697 | A * | 11/1998 | Baker | | H01B 11/02 174/34 |
| 5,930,678 | A * | 7/1999 | Alley | | H04N 7/10 455/69 |
| 6,466,913 | B1 * | 10/2002 | Yasuda | | G10L 21/00 704/E21.001 |
| 6,721,371 | B1 * | 4/2004 | Barham | | H03H 17/0294 329/363 |
| 7,530,091 | B2 * | 5/2009 | Vaughan | | H04M 7/006 725/127 |
| 7,883,363 | B2 * | 2/2011 | Montena | | H01R 24/44 439/654 |
| 8,045,066 | B2 * | 10/2011 | Vorenkamp | | H01L 23/5227 348/731 |
| 8,429,695 | B2 * | 4/2013 | Halik | | H04L 12/2801 725/127 |
| 8,589,997 | B2 * | 11/2013 | Wells | | H04N 21/2221 725/127 |
| 8,611,528 | B2 * | 12/2013 | Hazani | | H01R 31/065 379/413.04 |
| 9,549,221 | B2 * | 1/2017 | Into | | H04N 7/104 |
| 10,979,256 | B2 * | 4/2021 | Sun | | H03G 1/0088 |
| 2001/0046268 | A1 * | 11/2001 | Sharma | | H04J 1/05 348/E7.069 |
| 2002/0056135 | A1 * | 5/2002 | Sharma | | H04N 7/22 348/E7.07 |
| 2004/0244053 | A1 * | 12/2004 | Golombek | | H04N 21/6118 725/127 |
| 2005/0056454 | A1 * | 3/2005 | Clark | | H01B 11/02 174/113 R |
| 2006/0124342 | A1 * | 6/2006 | Clark | | H01B 11/02 174/113 R |
| 2006/0141976 | A1 * | 6/2006 | Rohde | | H03D 7/1441 455/326 |
| 2007/0101370 | A1 * | 5/2007 | Calderwood | | H04N 21/47214 725/38 |
| 2008/0227333 | A1 * | 9/2008 | Hazani | | H04B 3/542 439/578 |
| 2008/0231111 | A1 * | 9/2008 | Hazani | | H01R 13/719 307/3 |
| 2010/0017842 | A1 * | 1/2010 | Wells | | H04M 11/066 725/149 |
| 2010/0100918 | A1 * | 4/2010 | Egan, Jr. | | H04N 7/102 725/111 |
| 2010/0125877 | A1 * | 5/2010 | Wells | | H04N 7/17309 725/127 |
| 2010/0146564 | A1 * | 6/2010 | Halik | | H04N 7/104 725/127 |
| 2010/0311277 | A1 * | 12/2010 | Montena | | H01R 24/44 333/260 |
| 2011/0154429 | A1 * | 6/2011 | Stantchev | | H01Q 1/24 343/702 |
| 2012/0151548 | A1 * | 6/2012 | Rakib | | H04N 7/22 725/126 |
| 2013/0125193 | A1 * | 5/2013 | Wells | | H04N 21/6168 725/127 |
| 2013/0227632 | A1 * | 8/2013 | Wells | | H04L 12/2801 725/127 |
| 2014/0033264 | A1 * | 1/2014 | Li | | H04N 21/61 725/127 |
| 2014/0036982 | A1 * | 2/2014 | Ali | | H04B 3/04 375/229 |
| 2014/0119675 | A1 * | 5/2014 | Kim | | G06T 3/40 382/299 |
| 2015/0189364 | A1 * | 7/2015 | Into | | H04N 21/4854 725/37 |
| 2015/0295736 | A1 * | 10/2015 | Bulzacchelli | | H04L 25/03057 375/233 |
| 2016/0261435 | A1 * | 9/2016 | Musah | | H04L 7/0334 |

* cited by examiner

IMAGE SIGNAL TRANSMISSION APPARATUS AND SIGNAL OUTPUT CIRCUIT APPLYING BANDWIDTH BROADENING MECHANISM THEREOF

BACKGROUND OF THE INVENTION

1. Field of the Invention

The present invention relates to an image signal transmission apparatus and a signal output circuit applying bandwidth broadening mechanism thereof.

2. Description of Related Art

High definition multimedia interface (HDMI) is a video and audio transmission interface that performs transmission in fully digital form, and is capable of transmitting uncompressed audio signal and video signal. Since both the audio signal and the video signal can be transmitted by using the same wire, HDMI transmission technology simplifies the installation of the system wires.

In a system that uses such a transmission technology, a source terminal transmitting the video and audio signals and a sink terminal receiving the video and audio signals are included. A signal output circuit is required to be disposed in the source terminal to modify the video and audio signals such that the sink terminal receives the video and audio signals with high quality. However, in conventional design, the signal output circuit can not balance the signal quality and the power consumption.

SUMMARY OF THE INVENTION

In consideration of the problem of the prior art, an object of the present invention is to supply an image signal transmission apparatus and a signal output circuit applying bandwidth broadening mechanism thereof.

The present invention discloses a signal output circuit having DC gain maintaining mechanism for an image signal transmission apparatus (TX) that includes a first driving circuit and a second driving circuit. The first driving circuit includes a continuous time linear equalizer (CTLE) and configured to receive a digital input signal to perform a high frequency enhancement thereon to increase a bandwidth of the digital input signal to generate a first output signal, in which a zero point and two poles of a frequency response of the first driving circuit are determined by a plurality of circuit parameters thereof. The second driving circuit is configured to receive and amplify the first output signal to generate a second output signal for an image receiving apparatus (RX).

The present invention also discloses an image signal transmission apparatus for an image signal transmission system that includes a digital signal processing circuit and a signal output circuit. The digital signal processing is configured to generate a digital input signal. The signal output circuit includes a first driving circuit and a second driving circuit. The first driving circuit includes a CTLE and configured to receive a digital input signal to perform a high frequency enhancement thereon to increase a bandwidth of the digital input signal to generate a first output signal, in which a zero point and two poles of a frequency response of the first driving circuit are determined by a plurality of circuit parameters thereof. The second driving circuit is configured to receive and amplify the first output signal to generate a second output signal for an image receiving apparatus.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an image signal transmission apparatus and a signal output circuit applying bandwidth broadening mechanism thereof to make signal output circuit have both large bandwidth and low power dissipation by disposing the first driving circuit.

Figure 1:
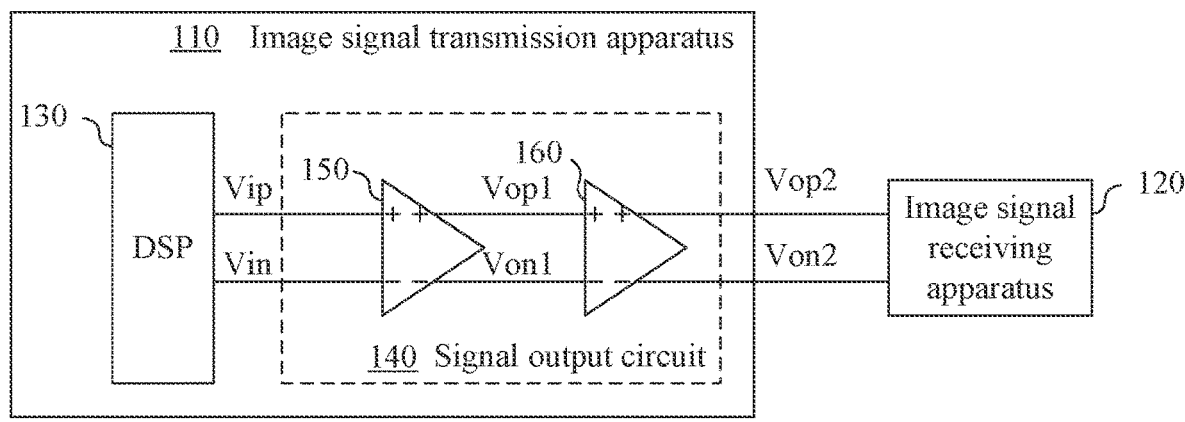
FIG. 1 illustrates a block diagram of an image signal transmission system according to an embodiment of the present invention.

Reference is now made to FIG. 1. FIG. 1 illustrates a block diagram of an image signal transmission system 100 according to an embodiment of the present invention. The image signal transmission system 100 includes an image signal transmission apparatus (TX) 110 and an image signal receiving apparatus (RX) 120.

In an embodiment, the image signal transmission system 100 is a system that transmits signals of image and sound (video/audio signal) according to high definition multimedia interface (HDMI) technology. The image signal transmission apparatus 110 servers as a source terminal, e.g., a set-up box, a DVD player or a computer. The image signal receiving apparatus 120 serves as a sink terminal, e.g., a television, a projector or other display devices. The image signal transmission apparatus 110 is configured to perform processing on the video/audio signal and transmit the video/audio signal to the image signal receiving apparatus 120 to be playback.

The image signal transmission apparatus 110 includes a digital signal processing circuit 130 (abbreviated as DSP in FIG. 1) and a signal output circuit 140.

The digital signal processing circuit 130 is configured to generate a digital input signal, which is a differential signal and actually includes digital input signals Vip and Vin. The signal output circuit 140 has a bandwidth broadening mechanism to enhance and output the digital input signals Vip and Vin. The signal output circuit 140 includes a first driving circuit 150 and a second driving circuit 160.

In an embodiment, the first driving circuit 150 is a front-stage driving circuit. The first driving circuit 150 is configured to receive the digital input signals Vip and Vin to perform high frequency enhancement to increase the bandwidth of the digital input signals Vip and Vin and further generate a first output signal which is also a differential signal and actually includes first output signals Vop1 and Von1.

Figure 2:
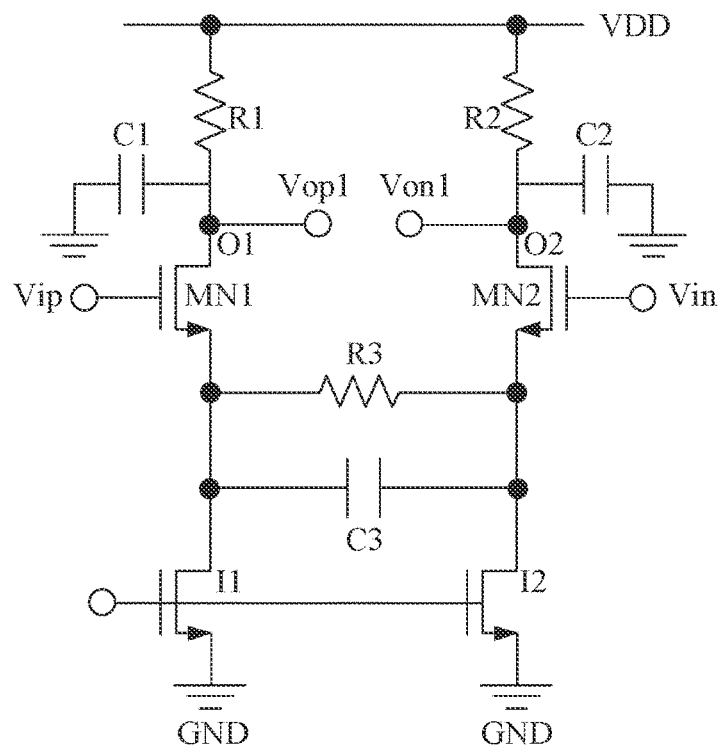
FIG. 2 illustrates a circuit diagram of the first driving circuit according to an embodiment of the present invention.

Reference is now made to FIG. 2. FIG. 2 illustrates a circuit diagram of the first driving circuit 150 according to an embodiment of the present invention. In an embodiment, the first driving circuit 150 includes a first continuous time linear equalizer (CTLE). More specifically, the CTLE includes two input transistors MN1 and MN2, two load resistors R1 and R2, two load capacitors C1 and C2, an adjusting resistor R3, an adjusting capacitor C3 and two current sources I1 and I2.

Each of the input transistors MN1 and MN2 includes a gate, a drain and a source. The gate of the input transistor MN1 is configured to receive the digital input signal Vip. The gate of the input transistor MN2 is configured to receive the digital input signal Vin. The drain of the input transistors MN1 is electrically coupled to an output terminal O1. The drain of the input transistors MN2 is electrically coupled to an output terminal O2. The drain of the input transistors MN1 is configured to generate the first output signal Vop1 to the output terminal O1. The drain of the input transistors MN2 is configured to generate the first output signal Von1 to the output terminal O2.

The load resistors R1 is electrically coupled between the drain of the input transistors MN1 and an operation voltage source VDD. The load resistors R2 is electrically coupled between the drain of the input transistors MN2 and the operation voltage source VDD. The load capacitors C1 is electrically coupled between the drain of the input transistors MN1 and the ground terminal GND. The load capacitors C2 is electrically coupled between the drain of the input transistors MN2 and the ground terminal GND. The adjusting resistor R3 and the adjusting capacitor C3 are electrically coupled in parallel between the sources of the input transistors MN1 and MN2. The current source I1 is electrically coupled between the source of the input transistors MN1 and a ground terminal GND. The current source I2 is electrically coupled between the source of the input transistors MN2 and the ground terminal GND.

In an embodiment, a zero and two poles of a frequency response of the first driving circuit 150 are determined by a plurality of circuit parameters of the first driving circuit 150.

Figure 3:
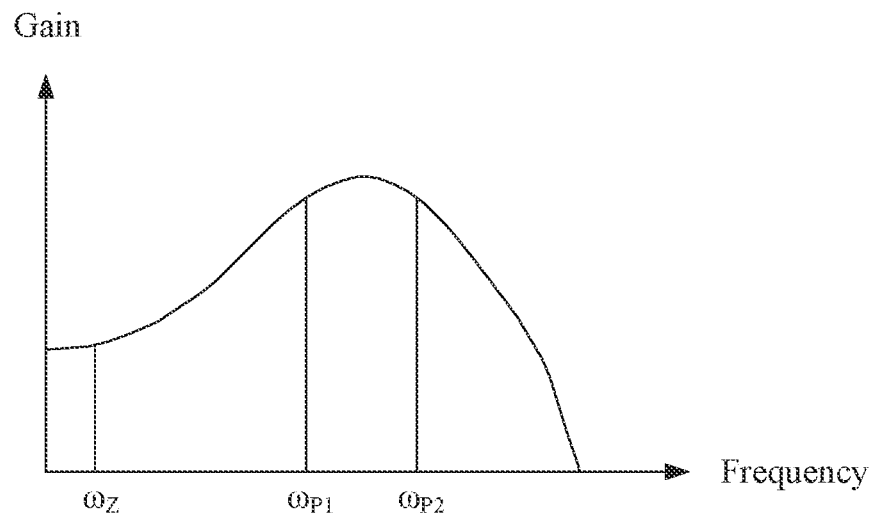
FIG. 3 illustrates a diagram of a frequency response of the first driving circuit according to an embodiment of the present invention.

Reference is now made to FIG. 3 at the same time. FIG. 3 illustrates a diagram of a frequency response of the first driving circuit 150 according to an embodiment of the present invention. The X-axis corresponds to the frequency and the Y-axis corresponds to the gain.

In an embodiment, the circuit parameters of the first driving circuit 150 include a transconductance of the two input transistors, a resistance of each of the two load resistors, a capacitance of each of the two load capacitors, a resistance of the adjusting resistor, and a capacitance of the adjusting capacitor. For example, the transconductance of the two input transistors is gm, the resistance of each of the two load resistors is Rd, the capacitance of each of the two load capacitors is Cd, the resistance of the adjusting resistor is Rs and the capacitance of the adjusting capacitor is Cs.

As a result, a transfer function H(s) of the first driving circuit 150, i.e., the transfer function between the digital input signal and the first output signal, is expressed as:

$$(gmRd)(1+sRsCs)/((1+sRcCs+(gmRs/2))/(1+sRdCd)')$$

Further, the DC gain of the first driving circuit 150 is expressed as:

$$(gmRd)/(1+(gmRs/2))$$

The zero $\omega_Z$ at the frequency response is expressed as:

$$\omega_Z = 1/(RsCs)$$

One of the two poles $\omega_{P1}$ is expressed as:

$$\omega_{P1} = (1+gmRs/2)/(RsCs)$$

The other one of the two poles $\omega_{P2}$ is expressed as:

$$\omega_{P2} = 1/(RdCd)$$

As a result, by adjusting the circuit parameters, the zero and the two poles of the frequency response of the first driving circuit 150 can be adjusted accordingly such that the DC gain and the high frequency part of the signal can be increased with different degrees.

Figure 4:
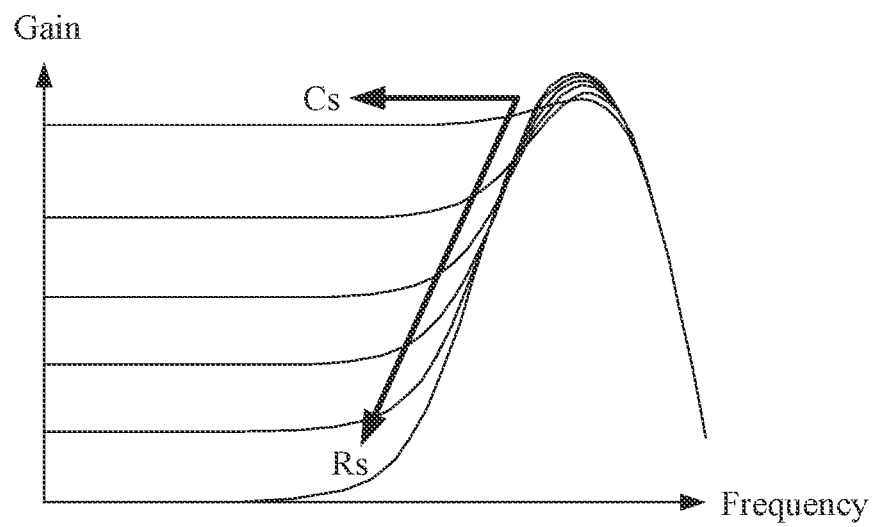
FIG. 4 illustrates a diagram of the frequency response under the conditions that the resistance of the adjusting resistor and the capacitance of the adjusting capacitor of the first driving circuit are different according to an embodiment of the present invention.

Reference is now made to FIG. 4. FIG. 4 illustrates a diagram of the frequency response under the conditions that the resistance Rs of the adjusting resistor R3 and the capacitance Cs of the adjusting capacitor C3 of the first driving circuit 150 are different according to an embodiment of the present invention. The X-axis corresponds to the frequency and the Y-axis corresponds to the gain.

In FIG. 4, the arrow labeled as Rs represents the trend of the frequency response when the resistance Rs is larger. As illustrated in FIG. 4, when the resistance Rs is larger, the DC gain is smaller. On the other hand, the arrow labeled as Cs represents the trend of the frequency response when the capacitance Cs is larger. As illustrated in FIG. 4, when the capacitance Cs is larger, the locations of the zero and the poles moves towards the low frequency range.

As a result, under a proper selection of the values of the resistance Rs and the capacitance Cs, the first driving circuit 150 can increase the high frequency response of the digital input signals Vip and Vin and further increase the bandwidth of the digital input signals Vip and Vin.

In an embodiment, the second driving circuit 160 is a back-stage driving circuit. The second driving circuit 160 is configured to receive and amplify the first output signals Vip and Vin to generate a second output signal for the image receiving apparatus 120. In an embodiment, the second driving circuit 160 includes a current mode logic (CML) circuit. Further, the second output signal is a differential signal that actually includes second output signals Vop2 and Von2.

In some approaches, the signal output circuit includes two stages of CML circuits to perform power amplification. However, such a method is not able to accomplish the object of power-saving since the CML circuits consumes more power.

On the contrary, the signal output circuit of the present invention can accomplish both large bandwidth and low power dissipation by disposing the first driving circuit implemented by CTLE that consumes less current and increases the bandwidth of the output signal.

It is appreciated that the embodiments described above are merely an example. In other embodiments, it should be appreciated that many modifications and changes may be made by those of ordinary skill in the art without departing, from the spirit of the disclosure.

In summary, the image signal transmission apparatus and the signal output circuit applying bandwidth broadening mechanism thereof of the present invention makes signal output circuit have both large bandwidth and low power dissipation by disposing the first driving circuit.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A signal output circuit applying bandwidth broadening mechanism for an image signal transmission apparatus (TX), comprising:
   a first driving circuit comprising a continuous time linear equalizer (CTLE) and configured to receive a digital input signal to perform a high frequency enhancement thereon to increase a bandwidth of the digital input signal to generate a first output signal, in which a zero point and two poles of a frequency response of the first driving circuit are determined by a plurality of circuit parameters thereof, wherein the first driving circuit receives the digital input signal from a digital signal processing circuit comprised by the signal transmission apparatus; and
   a second driving circuit configured to receive and amplify the first output signal to generate a second output signal for an image receiving apparatus (RX).

2. The signal output circuit of claim 1, wherein each of the digital input signal, the first output signal and the second output signal is a differential signal.

3. The signal output circuit of claim 1, wherein the CTLE comprises:
   two input transistors each comprising:
     a gate configured to receive the digital input signal;
     a drain electrically coupled to an output terminal and configured to generate the first output signal to the output terminal; and
     a source;
   two load resistors each electrically coupled between the drain of one of the two input transistors and an operation voltage source;
   two load capacitors each electrically coupled to the drain of one of the two input transistors and a ground terminal;
   an adjusting resistor and the adjusting capacitor electrically coupled in parallel between the sources of the two input transistors; and
   two current sources each electrically coupled between the source of one of the two input transistors and the ground terminal.

4. The signal output circuit of claim 3, wherein the circuit parameters comprise a resistance of each of the two load resistors, a capacitance of each of the two load capacitors, a resistance of the adjusting resistor, and a capacitance of the adjusting capacitor.

5. The signal output circuit of claim 4, wherein the resistance of each of the two load resistors is Rd, the capacitance of each of the two load capacitors is Cd, the resistance of the adjusting resistor is Rs, the capacitance of the adjusting capacitor is Cs and the transconductance of the two input transistors is gm, the zero is 1/(RsCs) and the two poles are respectively (1+gmRs/2)/(RsCs) and 1/(RdCd).

6. The signal output circuit of claim 5, wherein a transfer function between the digital input signal and the first output signal is:

$$(gmRd)(1+sRsCs)/((1+sRcCs+(gmRs/2))/(1+sRdCd)').$$

7. The signal output circuit of claim 5, wherein a direct current (DC) gain of the CTLE is:

$$(gmRd)/(1+(gmRs/2)).$$

8. The signal output circuit of claim 1, wherein the second driving circuit includes a current mode logic (CML) circuit.

9. The signal output circuit of claim 1, wherein the first driving circuit is a front-stage driving circuit and the second driving circuit is a back-stage driving circuit.

10. An image signal transmission apparatus for an image signal transmission system, comprising:
    a digital signal processing circuit configured to generate a digital input signal; and
    a signal output circuit comprising:
      a first driving circuit comprising a CTLE and configured to receive the digital input signal from the digital signal processing circuit to perform a high frequency enhancement thereon to increase a bandwidth of the digital input signal to generate a first output signal, in which a zero point and two poles of a frequency response of the first driving circuit are determined by a plurality of circuit parameters thereof; and
      a second driving circuit configured to receive and amplify the first output signal to generate a second output signal for an image receiving apparatus.

11. The image signal transmission apparatus of claim 10, wherein each of the digital input signal, the first output signal and the second output signal is a differential signal.

12. The image signal transmission apparatus of claim 10, wherein the CTLE comprises:
    two input transistors each comprising:
      a gate configured to receive the digital input signal;
      a drain electrically coupled to an output terminal and configured to generate the first output signal to the output terminal; and
      a source;
    two load resistors each electrically coupled between the drain of one of the two input transistors and an operation voltage source;
    two load capacitors each electrically coupled to the drain of one of the two input transistors and a ground terminal;
    an adjusting resistor and the adjusting capacitor electrically coupled in parallel between the sources of the two input transistors; and
    two current sources each electrically coupled between the source of one of the two input transistors and the ground terminal.

13. The image signal transmission apparatus of claim 12, wherein the circuit parameters comprise a resistance of each of the two load resistors, a capacitance of each of the two load capacitors, a resistance of the adjusting resistor, and a capacitance of the adjusting capacitor.

14. The image signal transmission apparatus of claim 13, wherein the resistance of each of the two load resistors is Rd, the capacitance of each of the two load capacitors is Cd, the resistance of the adjusting resistor is Rs, capacitance of the adjusting capacitor is Cs and the transconductance of the two input transistors is gm, the zero is 1/(RsCs) and the two poles are respectively (1+gmRs/2)/(RsCs) and 1/(RdCd).

15. The image signal transmission apparatus of claim 14, wherein a transfer function between the digital input signal and the first output signal is $$(gmRd)(1 + sRsCs)/((1 + sRcCs + (gmRs/2))/(1 + sRdCd)').$$

16. The image signal transmission apparatus of claim 14, wherein a DC gain of the CTLE is:

$$(gmRd)/(1 + (gmRs/2)).$$

17. The image signal transmission apparatus of claim 10, wherein the second driving circuit includes a CML circuit.

18. The image signal transmission apparatus of claim 10, wherein the first driving circuit is a front-stage driving circuit and the second driving circuit is a back-stage driving circuit.

* * * * *